United States Patent [19]
Vale

[11] Patent Number: 5,291,159
[45] Date of Patent: Mar. 1, 1994

[54] ACOUSTIC RESONATOR FILTER WITH ELECTRICALLY VARIABLE CENTER FREQUENCY AND BANDWIDTH

[75] Inventor: Christopher R. Vale, Elk Ridge, Md.

[73] Assignee: Westinghouse Electric Corp., Pittsburgh, Pa.

[21] Appl. No.: 916,238

[22] Filed: Jul. 20, 1992

[51] Int. Cl.⁵ .............................................. H03H 9/00
[52] U.S. Cl. ........................................ 333/188; 333/174
[58] Field of Search ............. 333/188, 189, 190, 174, 333/192

[56] References Cited

U.S. PATENT DOCUMENTS

| | | | |
|---|---|---|---|
| 2,619,535 | 11/1952 | Prior et al. | 333/189 |
| 3,344,369 | 9/1967 | Bies et al. | 333/189 |
| 3,559,124 | 8/1971 | Smith et al. | 333/72 |
| 3,569,873 | 3/1971 | Beaver | 333/192 |
| 3,609,661 | 9/1971 | Phillips | 333/192 |
| 3,613,031 | 10/1971 | Pond | 333/72 |
| 4,060,776 | 11/1977 | Blinchikoff | 333/189 |
| 4,353,045 | 10/1982 | Matsui et al. | 333/190 |
| 4,502,932 | 3/1985 | Kline et al. | 204/192 |
| 4,716,377 | 12/1987 | Inoue | 333/189 |
| 4,719,383 | 1/1988 | Wang et al. | 310/324 |
| 4,837,533 | 6/1989 | Oshikawa | 333/189 |
| 5,030,934 | 7/1991 | Kinsman | 333/188 |
| 5,051,711 | 9/1991 | Jones | 333/188 |
| 5,077,544 | 12/1991 | Ogawa et al. | 333/189 |
| 5,151,672 | 9/1992 | Noto et al. | 333/192 |
| 5,216,392 | 6/1993 | Fraser et al. | 333/188 |

FOREIGN PATENT DOCUMENTS

| | | | |
|---|---|---|---|
| 0146122 | 8/1983 | Japan | 333/189 |
| 0314008 | 12/1989 | Japan | 333/189 |

OTHER PUBLICATIONS

*The Analysis, Design and Synthesis of Electrical Filters* by DeVerl S. Humpherys, pp. 488–495.

Primary Examiner—Raymond A. Nelli
Attorney, Agent, or Firm—D. Schron

[57] ABSTRACT

An acoustic resonator filter having at least one of electronically variable center frequency and bandwidth has a shunt coupling consisting of an inductor and voltage variable capacitor matrix. A pair of acoustic resonators each having a parallel inductor are connected to each other and to the shunt coupling network. One of a pair of voltage variable capacitor matrixes each having a center frequency command input voltage is connected to each acoustic resonator and an associated inductor. This circuit can be extended to provide more selectivity and attenuation.

10 Claims, 4 Drawing Sheets

5,291,159

ACOUSTIC RESONATOR FILTER WITH ELECTRICALLY VARIABLE CENTER FREQUENCY AND BANDWIDTH

BACKGROUND OF THE INVENTION

1. Field of the Invention

The invention relates to a filter particularly useful for radar and communication systems which has the capability for tuning the center frequency and/or the bandwidth of the receiver with command voltages.

2. Description of the Prior Art

The art has developed a variety of filters for use with radar and communications systems. One group of filters are capable of being mechanically tuned to a particularly frequency and/or a particular bandwidth. These filters are manually tuned and very slow to operate. A second group of filters is comprised of several banks of electronically switched filter components. These systems are very large and complex. Typically, the systems include inductor capacitor or cavity devices which are prone to be unstable with changes in the environment. Thus, there is a need for an acoustic resonator filter capable of being electronically tuned to desired center frequency and/or bandwidth.

Acoustic resonators in the frequency band below 300 MHZ are typically quartz crystals. They are well known for their high quality factor, small size and good stability. Although this invention is useful with quartz crystals, the principal benefit is envisioned as applying it to newly developed Film Bulk Acoustic Resonators (FBAR's). These are monolithic microwave resonators fabricated to operate in the frequency band 0.2 GHZ to 10 GHZ. Preferably the filter is capable of being fabricated as a monolithic device using known semiconductor fabrication technology; but it may also be realized by hybrid electronics techniques.

SUMMARY OF THE INVENTION

I have developed an acoustic resonator filter having an electronically variable center frequency and bandwidth capability. My filter includes a shunt coupling network consisting of an inductor and a voltage variable capacitor matrix (also called a varactor matrix) having a bandwidth command input. This matrix is connected to the first inductor and to ground. I provide a pair of acoustic resonators each having a parallel inductor. Both the resonators are connected to the shunt inductor network, thus providing coupling between the resonators. Each resonator is also connected to a voltage variable capacitor matrix having a center frequency command input. A second inductor is connected to one variable capacitor matrix. A third inductor is connected to the other variable capacitor matrix. Preferably, the acoustic resonators are Film Bulk Acoustic Resonators (FBAR). The "T" network thus formed, shown in FIG. 3, is a variable center frequency, variable bandwidth, two pole crystal filter having a source impedance $R_s$ and a load impedance $R_L$. Other objects and advantages of the invention will become apparent from a description of the present preferred embodiments shown in the drawings.

DESCRIPTION OF THE PREFERRED EMBODIMENTS

Bulk acoustic resonators are well known for their very high Q (loss loss), small size, and environmental stability. The most famous embodiment is the quartz crystal which is used from 1 KHz to 300 MHz; and the newest embodiment is the Film Bulk Acoustic Resonator (FBAR) projected to be useful from 200 MHz to 10 GHZ. All acoustic resonators have the equivalent electrical circuit shown in FIG. 1. The non-trivial form of the dipole, especially the parallel capacitor Cp, has previously prevented the use of acoustic resonators in variable bandwidth or variable center frequency filters. The simple series resonant circuit shown in FIG. 2 is the ideal element for such filters. In my acoustic wave filter the acoustic resonator can be made to approximate the ideal over a limited bandwidth and thus become the resonating element in practical variable filters.

Figure 1:
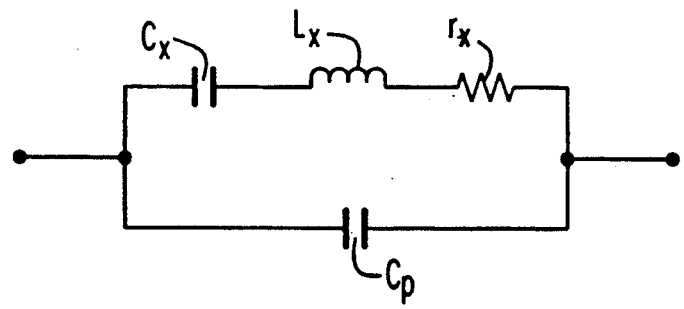
FIG. 1 is a circuit diagram of the equivalent electrical circuit for acoustic resonators.
Figure 2:
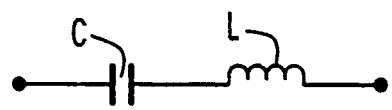
FIG. 2 is an ideal resonator circuit for a variable bandwidth or variable center frequency filter.
Figure 3:
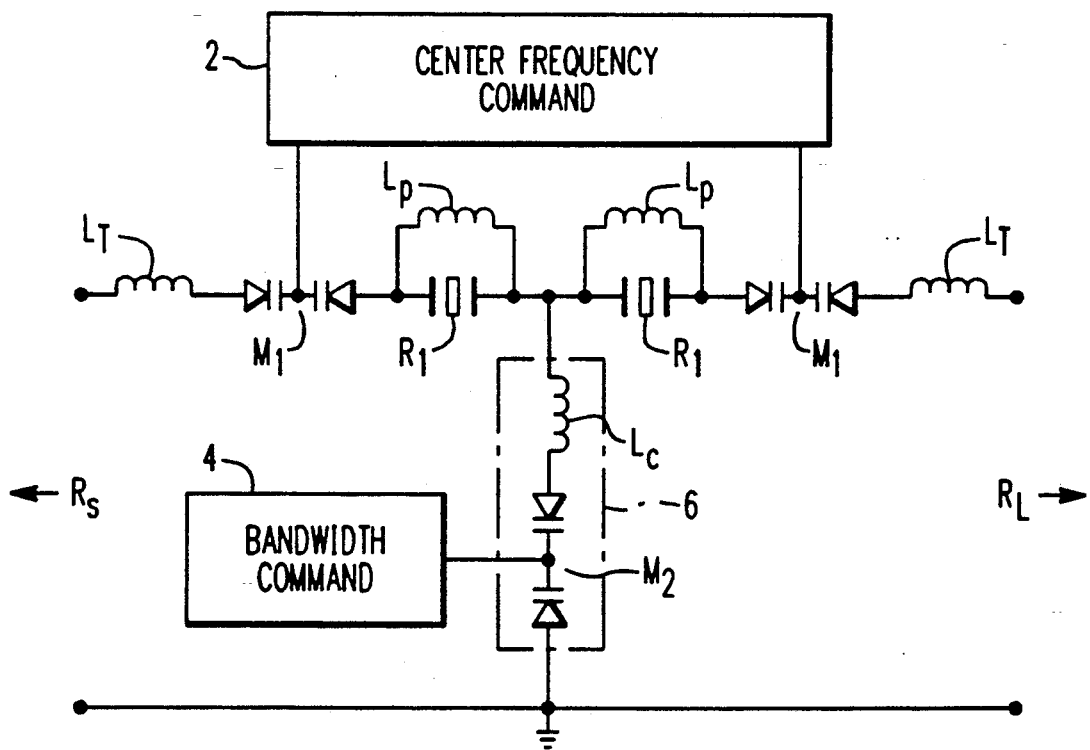
FIG. 3 is a circuit diagram showing a present preferred embodiment of my voltage variable acoustic resonator filter.

A present preferred embodiment of my filter is shown in FIG. 3. It is essentially a crystal ladder configuration designed on principles exposed by Deverl S. Humpherys in *The Analysis Design, and Synthesis of Electrical Filters* (Prentice Hall, Englewood Cliffs, N.J., (1970), pp. 489–495. The embodiment of FIG. 3 is a two pole network, but the present invention could be adapted for higher order filters using the same techniques. The wave filter contains a pair of voltage variable capacitor matrixes $M_1$ in series and another voltage variable capacitor matrix $M_2$ and associated inductor $L_c$ in a shunt coupling network (6). Matrixes $M_1$ are connected to a Center Frequency Control 2. Matrix $M_2$ is connected to a Bandwidth Control 4. These controls provide input voltages corresponding to the frequency or bandwidth selected by the user. The GC15000 series varactors made by Frequency Sources can be used for $M_1$ and $M_2$. I also provide inductors $L_T$, $L_c$ and $L_p$ which preferably are monolithic spiral inductors or they can be the type made by Microwave Components, Inc. Finally, I provide two acoustic resonators $R_l$ which preferably are film bulk acoustic resonators or FBAR's. Although I am unaware of any commercially available FBAR's suitable for my filter these components can be fabricated by following the techniques of U.S. Pat. Nos. 4,719,383 and 4,502,932. The resonators $R_l$ have an inductor in parallel that resonates with Cp at a frequency equal to the center frequency of the tuning range. The effect is to nullify the tuning restriction caused by Cp over a band approximately equal to:

$$f_0 * \sqrt{L_p/L_x}$$

where Lp is the inductor of FIG. 3 and Lx is the inductor of FIG. 1 and fo is the center frequency of the tuning range.

In this band the acoustic resonator behaves almost like the ideal series resonator shown in FIG. 2. Both resonators are identical leading to ease of manufacture. The center frequency tuning is accomplished with the voltage variable capacitor matrixes $M_1$. A back-to-back arrangement is used in order to reduce harmonic generation from the desired RF signal. Satisfactory matrixes are available packaged in pairs; several pairs may be connected in parallel to increase the effective tuning capacity. An inductor $L_t$ is connected in series with $M_1$ to increase the tuning range. Without this, $M_1$ would only be able to move the filter to frequencies above the center of the tuning range. The inductor allows the filter frequency to be moved below the center as well. $L_t$ is chosen to resonate with $M_1$'s mid-range value at a frequency equal to the middle of the expected center of the tuning range. The acoustic resonator, $R_t$, has the equivalent electrical circuit shown in FIG. 1. Thus ceramic, quartz, lithium tantalate or FBAR resonators will perform as variable bandpass filter elements. The series resonant frequency is calculated using the Humphreys procedure and it is approximately located one-half of a bandwidth below the center frequency of the tuning range. $R_s$ usually is the same as $R_L$ and equals (approximately) 2*PI*BW3*Lx where PI is 3.14159265;

BW3 is the desired filter passband width measured at the 3dB down points; and

Lx is the value of motional inductance of the acoustic resonator (Lx). Therefore broadband transformers may be required at the terminals to provide impedance matching because a wide range of values for Lx is not usually available.

The shunt coupling network consisting of $L_c$ and $M_2$ is the bandwidth controlling element. The reactance of the mid-capacity of $M_2$ in series with $L_c$ is equivalent to a single capacitor calculated from the Humpherys procedure. It is approximately equal to:

$$Cx * (f_0/BW3)$$

Figure 4:
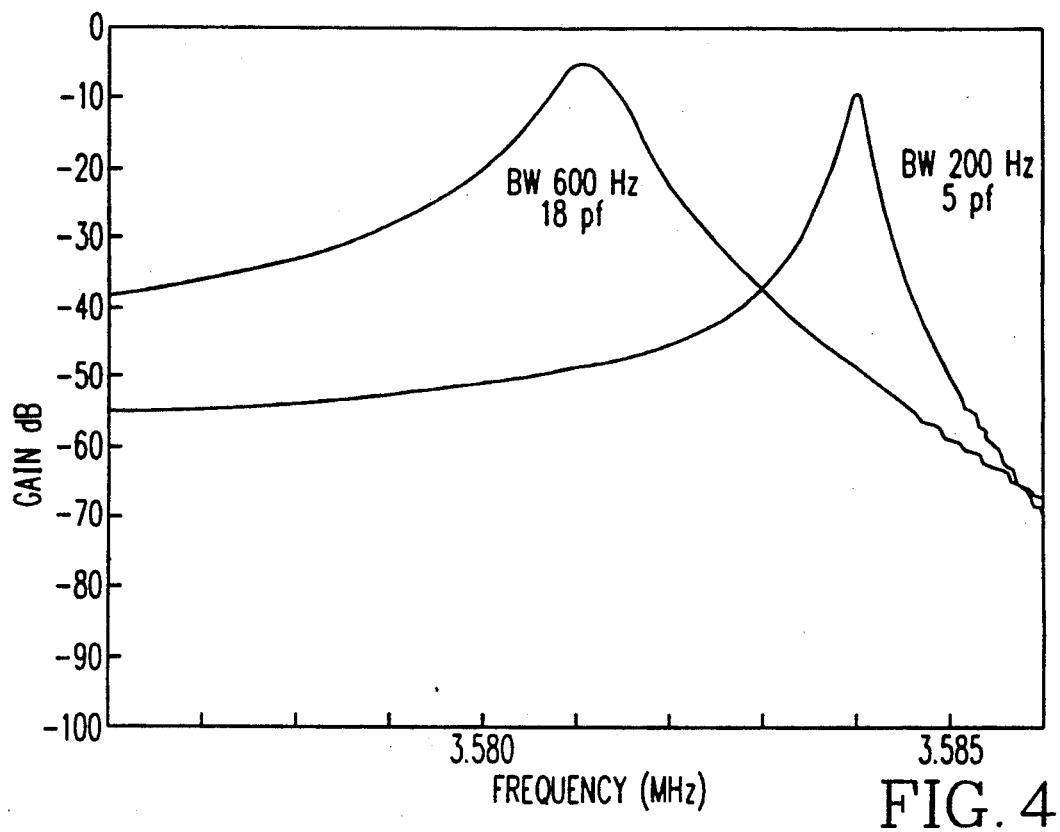
FIG. 4 is a graph showing the measured response of a quartz crystal prototype filter similar to that shown in FIG. 3 demonstrating variable center frequency.
Figure 5:
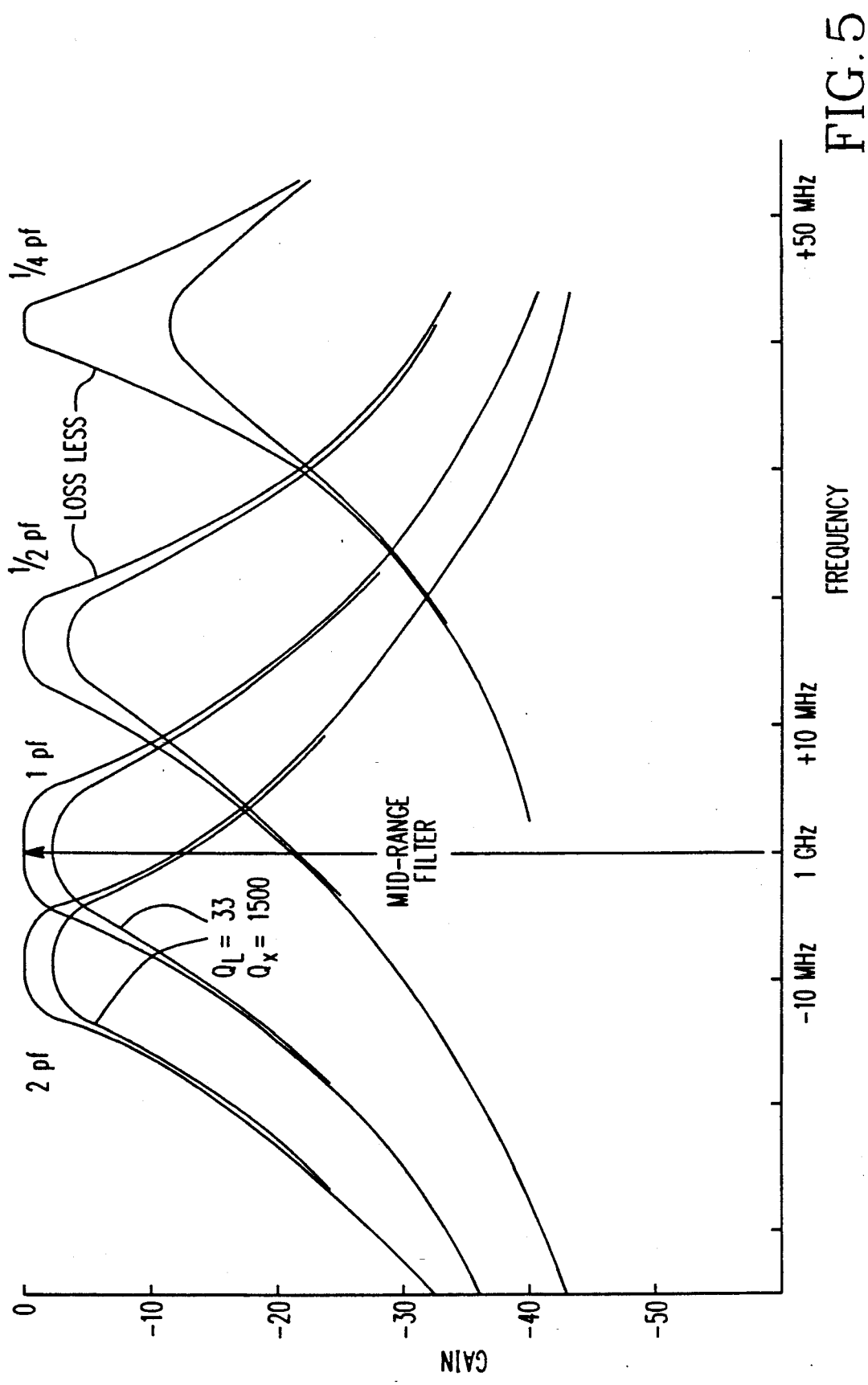
FIG. 5 is a graph showing computed responses for a variable filter which utilizes film bulk acoustic resonators and includes all the pertinent advantages of FIG. 3.

These principles have been tested separately in prototype practical circuits incorporating quartz crystals. FIG. 4 shows the response of a filter similar to FIG. 3 except the shunt coupling element is simply a fixed capacitor and there are no compensating inductors in parallel with the resonators. This leads to a narrow center frequency tuning range of only 0.1%. The benefits of using the compensating inductor and using resonators having lower ratio of parallel-to-series capacity is shown in the computed responses of FIG. 5. This is an FBAR filter and the analysis shows that it can be tuned below the center of the tuning range as well as above. It also shows that at extreme tuning positions the bandwidth changes drastically, whereas near the center, the bandwidth is almost constant as the filter center is tuned. It is desirable that when tuning for center frequency position that the bandwidth be nearly constant, but some second-order change of the bandwidth is tolerable.

Figure 6:
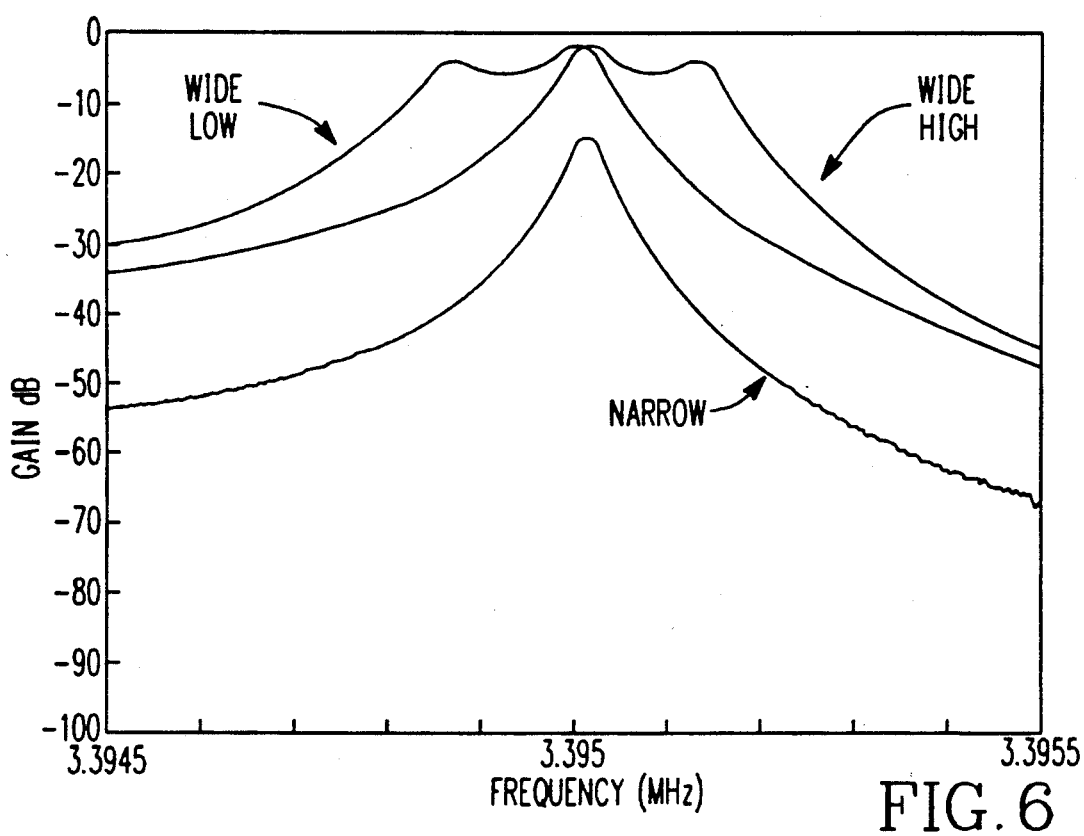
FIG. 6 is a graph showing the measured responses of a quartz crystal prototype filter configured like the circuit of FIG. 3 to demonstrate bandwidth variability.

Bandwidth variation has been demonstrated with the FIG. 3 circuit modified thus: 1) no compensating inductor in parallel with the resonator; and 2) no center frequency tuning network in series with the resonators. The measured performance is shown in FIG. 6. Note that one of the wide positions swings to the low frequency side of the narrow setting and it exhibits a high passband ripple. The other wide setting swings to the high side and also exhibits a high passband ripple. The narrow position is at the middle of the wide low and wide-high settings. The wide bandwidth is about 1200 Hz and the narrow is about 300 Hz in this prototype demonstration. This is achieved using quartz crystals in a variable bandwidth intermediate frequency filter for amateur radio continuous wave (code) reception.

Figure 7:
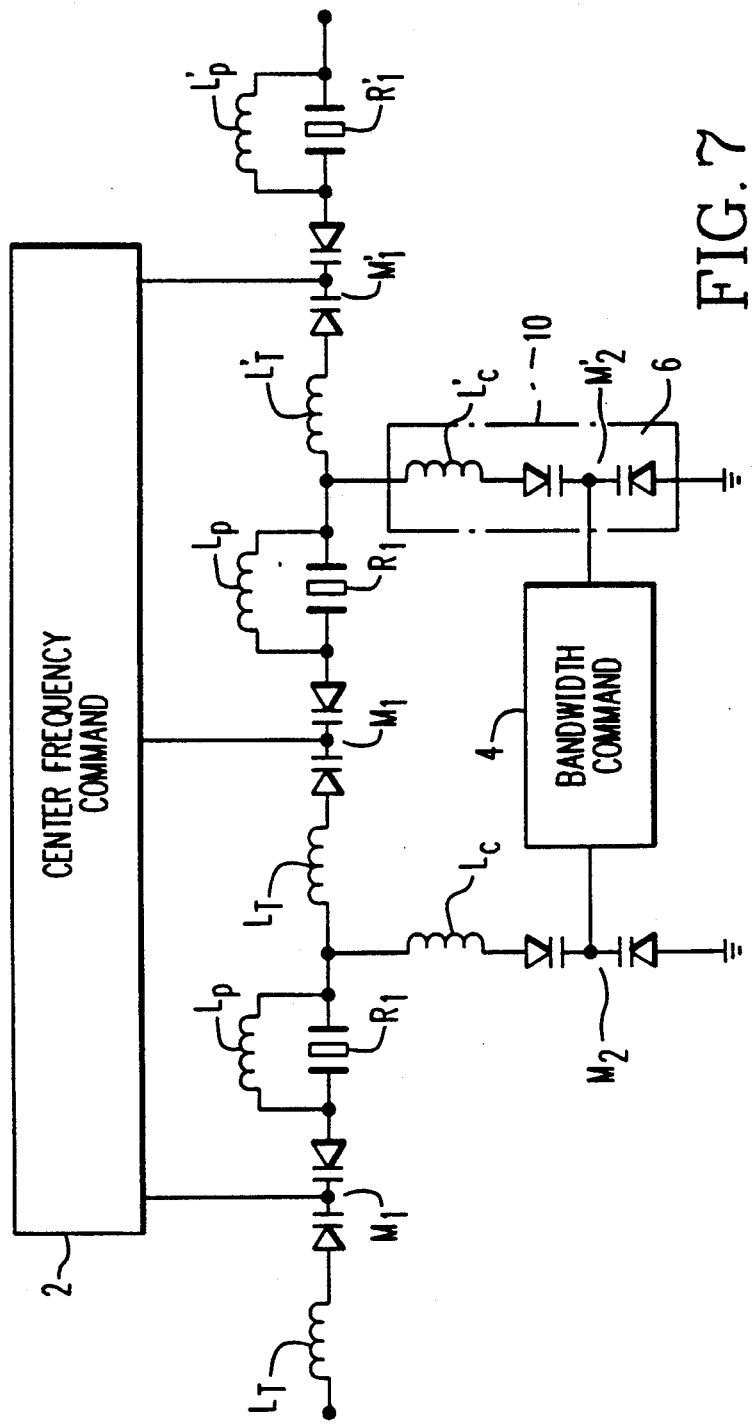
FIG. 7 is the voltage variable filter of FIG. 3 extended to a three pole design showing that the invention is not limited to just two acoustic resonators.

A variable filter incorporating all the features of FIG. 3 would perform better than shown in these figures. It would have somewhat wider center frequency tuning range with adequate constant bandwidth. I would also have a somewhat wider bandwidth range as well. Hence, my variable filter has the advantages of providing both an electronically variable center frequency and an electronically tuned bandwidth. Moreover, this filter has good stability and low insertion loss because of the acoustic resonator. Those versed in the art will understand that the series connection of $L_t$, $M_1$ and $R_1$ may be interchanged in several combinations without changing performance. Likewise with $L_C$ and $M_2$ series connection. The acoustic resonator filter can also be extended to provide more selectivity and attenuation as shown in FIG. 7. In this embodiment, I provide additional resonators and associated inductors and an acoustic resonator. Additional components $M_2'$ and $L_c'$ form a second shunt network 10. $L_T'$, $M_1'$ and parallel components $L_p'$ and $R_1'$ are connected to the second shunt network and the basic circuit as shown.

The present filter is also capable of being fabricated as a single integrated structure. Such a monolithic device could be made using known semiconductor fabrication methods. Hence, my filter could be a very small device. On the other hand, if my filter is made by connecting the various components on a circuit board, the device can be relatively small, particularly when compared to the tunable filters of the prior art.

The invention is not limited to the present preferred embodiments described and shown in the drawings, but may be variously embodied within the scope of the following claims:

I claim:

1. An acoustic resonator filter having at least one of electronically variable center frequency and electronically variable bandwidth comprising
    a) a shunt coupling network consisting of
        i) a first inductor and
        ii) a voltage variable capacitor matrix having a bandwidth command input voltage, the matrix connected to the first inductor and to ground;
    b) a pair of acoustic resonators each having a parallel inductor the resonators being connected to each other and to the shunt coupling network inductor;
    c) a pair of voltage variable capacitor matrixes each having a center frequency command input voltage, one such matrix being connected to each acoustic resonator;
    d) a second inductor connected to one variable capacitor matrix; and e) a third inductor connected to the other variable capacitor matrix.

2. The acoustic resonator filter of claim 1 wherein the filter is fabricated as a monolithic device.

3. The acoustic resonator filter of claim 1 wherein the filter is fabricated as a hybrid electronic device.

4. The acoustic resonator filter of claim 1 wherein the acoustic resonator is a bulk wave acoustic resonator.

5. The acoustic resonator filter of claim 4 wherein the bulk wave acoustic resonator is a quartz crystal.

6. The acoustic resonator filter of claim 4 wherein the acoustic resonator is a film bulk acoustic resonator.

7. The acoustic resonator filter of claim 6 wherein the film bulk acoustic resonator is made of zinc oxide.

8. The acoustic resonator filter of claim 1 wherein center frequency command is provided by voltage variable capacitor matrixes.

9. The acoustic resonator filter of claim 1 wherein bandwidth command is provided by a voltage variable capacitor matrix.

10. An acoustic resonator filter of claim 1 also comprising at least one additional acoustic resonator connected to the shunt coupling network so as to provide more selectivity and attenuation.

* * * * *